United States Patent [19]
Lee et al.

[11] Patent Number: 5,856,225
[45] Date of Patent: Jan. 5, 1999

[54] CREATION OF A SELF-ALIGNED, ION IMPLANTED CHANNEL REGION, AFTER SOURCE AND DRAIN FORMATION

[75] Inventors: Teck Koon Lee, Singapore, Singapore; Lap Chan, San Francisco, Calif.; Chock H. Gan; Po-Ching Liu, both of Singapore, Singapore

[73] Assignee: Chartered Semiconductor Manufacturing Ltd, Singapore, Singapore

[21] Appl. No.: 976,941

[22] Filed: Nov. 24, 1997

[51] Int. Cl.⁶ .................... H01L 21/336; H01L 21/3205; H01L 21/4763
[52] U.S. Cl. .......................... 438/291; 438/299; 438/592
[58] Field of Search .................... 438/289–291, 438/305, 296, 592, 299

[56] References Cited

U.S. PATENT DOCUMENTS

| | | |
|---|---|---|
| 4,359,816 | 11/1982 | Abbas et al. . |
| 4,701,775 | 10/1987 | Cosentino et al. ............... 357/23.12 |
| 4,992,388 | 2/1991 | Pfiester et al. . |
| 5,168,072 | 12/1992 | Moslehi . |
| 5,231,299 | 7/1993 | Ning et al. ............... 257/316 |
| 5,374,575 | 12/1994 | Kim et al. ............... 437/44 |
| 5,413,949 | 5/1995 | Hong . |
| 5,429,956 | 7/1995 | Shell et al. ............... 437/29 |
| 5,576,227 | 11/1996 | Hsu . |
| 5,614,430 | 3/1997 | Liang et al. ............... 437/45 |
| 5,686,321 | 11/1997 | Ko et al. . |
| 5,688,701 | 11/1997 | Kobayashi et al. . |

*Primary Examiner*—Richard A. Booth
*Attorney, Agent, or Firm*—George O. Saile; Stephen B. Ackerman

[57] ABSTRACT

A method of fabricating a MOSFET device, in which a source and drain region has been formed, prior to the formation of an ion implanted channel region, has been developed. The early creation of source and drain region allows a high temperature anneal to be performed, removing damage resulting from the source and drain ion implantation procedures, however without redistribution of channel dopants. The method features creating an opening in an insulator layer, after the source and drain formation, and then forming the channel region in the semiconductor substrate, directly underlying the opening in the insulator layer. A polysilicon gate structure is next formed in the opening, resulting in self-alignment to the underlying channel region.

22 Claims, 5 Drawing Sheets

CREATION OF A SELF-ALIGNED, ION IMPLANTED CHANNEL REGION, AFTER SOURCE AND DRAIN FORMATION

BACKGROUND OF THE INVENTION (1) Field of the Invention

The present invention relates to a method of fabricating metal oxide semiconductor field effect transistors, (MOSFET), and more specifically to a process used to improve the yield and performance of the MOSFET devices.

(2) Description of the Prior Art

The semiconductor industry is continually striving to improve device performance while still maintaining, or even decreasing, the cost of the semiconductor product. These objectives have been partially satisfied by the ability of the industry to create smaller semiconductor devices, thus enabling more semiconductor chips to be realized from a starting substrate, thus reducing the processing cost for a specific semiconductor chip. The ability to fabricate devices, with sub-micron features, has been the main contributor in obtaining smaller chips, with the smaller chips still possessing a level of integration, equal to the integration achieved with larger counterparts. In addition to satisfying the cost objectives, the use of sub-micron features, or micro-miniaturization, has also resulted in performance increases, resulting from the decreased capacitances and resistances, realized from the smaller dimensions.

However even with the use of micro-miniaturization, semiconductor engineering is still striving for additional methods to further improve device performance and yield. For example Liang, et al, in U.S. Pat No. 5,614,430, describe a MOSFET device in which an anti-punchthrough region is formed in a sub-half micron channel length region, featuring the self-alignment of the anti-punchthrough region, to an overlying polysilicon gate structure. This procedure allows the parasitic capacitance, realized from the anti-punchthrough region, to be minimized, or confined to only the region directly below the polysilicon gate. The present invention will also address the self-alignment of a channel region to an overlying gate structure. However this invention will also describe a process in which the self-aligned channel region is created after the formation of ion implanted source and drain regions. This sequence allows the annealing of source and drain regions to be performed, removing ion implant damage, without redistribution of the channel region dopants. The sensitive channel region dopants, used for threshold voltage adjustments, as well as anti-punchthrough purposes, are subsequently created, and subjected to a minimum of high temperature procedures, thus maintaining the preferred location of these sensitive regions.

SUMMARY OF THE INVENTION

It is an objective of this invention to provide a process for fabricating a MOSFET device, featuring an ion implanted channel region, formed after the creation of a source and drain region.

It is another object of this invention to self-align a polysilicon gate structure, to an underlying ion implanted channel region.

It is still another object of this invention to self-align the channel region to a source and drain region.

In accordance with the present invention a process for fabricating a MOSFET device, featuring an ion implanted channel region, self-aligned to an overlying polysilicon gate structure, and to a source and drain region, and created after formation of the source and drain region, is described. After formation of shallow trench isolation regions, a dummy polysilicon structure is created, and used as a mask to form a lightly doped source and drain region. Silicon nitride spacers are formed on the dummy polysilicon structure, followed by the formation of heavily doped source and drain regions, and the formation of a metal silicide layer, on the top surface of the heavily doped source and drain region. An insulator layer is deposited and planarized, to expose the top surface of the dummy polysilicon structure, followed by the removal of the dummy polysilicon structure, leaving an opening in the insulator layer, coated with the silicon nitride spacers. A channel region, consisting of a threshold voltage adjust region, as well as anti-punchthrough region, is ion implanted in a region of the semiconductor substrate, directly underlying the opening in the insulator layer, and self-aligned to the adjacent source and drain regions. A gate insulator layer is grown on the surface of the semiconductor substrate, exposed in the opening in the insulator layer, followed by the deposition of a polysilicon layer, completely filling the opening in the insulator layer. After doping of the polysilicon layer via ion implantation procedures, a chemical mechanical polishing procedure is used to remove polysilicon from the top surface of the insulator layer, resulting in the formation of a polysilicon gate structure, on the gate insulator layer, in the opening of the insulator layer, with the polysilicon gate structure self aligned to the underlying ion implanted channel region. A metal silicide layer is then formed on the top surface of the device polysilicon gate structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method or fabricating a MOSFET device, with an ion implanted channel region, self-aligned to an overlying polysilicon gate structure, and to an adjacent source and drain region, and created after the formation of a source and drain region, will now be described in detail. Although the MOSFET device described in this invention is an N channel or NFET device, this invention can also be incorporated into P channel, or PFET devices.

Figure 1:
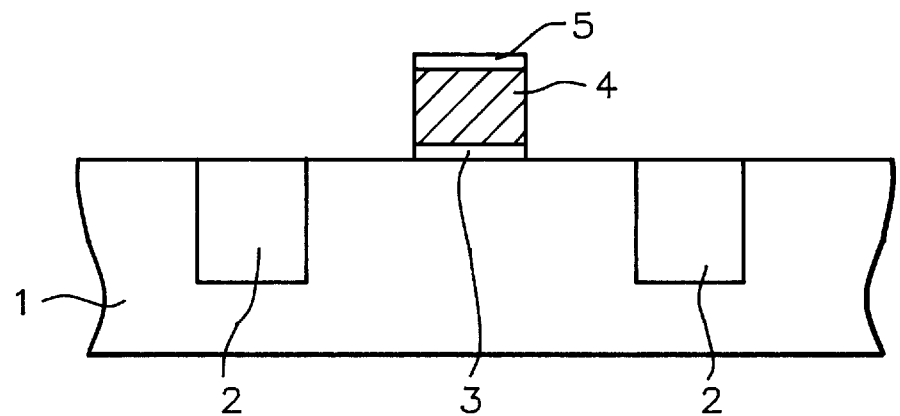
FIGS. 1–10, which schematically in cross-sectional style, show the key fabrication stages used to create a MOSFET device, with an ion implanted channel region, self aligned to an overlying device polysilicon structure, and self-aligned to an adjacent source and drain region, formed after creation of a source and drain region.

A P type, semiconductor substrate 1, comprised of single crystalline silicon, with a <100> crystallographic orientation is used, and schematically shown in FIG. 1. Shallow trench isolation, (STI), regions 2, are formed in semiconductor substrate 1, via creation of shallow trenches, in semiconductor substrate 1, formed via reactive ion etching, (RIE), using $Cl_2$ as an etchant, followed by filling of the shallow trenches with a silicon oxide layer, obtained using either low pressure chemical vapor deposition, (LPCVD), or plasma enhanced chemical vapor deposition, (PECVD), using tetraethylorthosilicate, (TEOS), as a source. Removal of unwanted silicon oxide, from regions outside the shallow trenches, via either RIB or chemical mechanical polishing, (CMP), procedures, complete the process for forming STI regions 2, schematically shown in FIG. 1.

A pad insulator layer 3, comprised of silicon oxide, deposited using LPCVD or PECVD procedures, to a thickness between about 20 to 40 Angstroms, is next deposited. A first polysilicon layer 4, is next deposited, using LPCVD procedures, to a thickness between about 2000 to 6000 Angstroms, followed by the deposition of a capping insulator layer 5, of silicon oxide, again deposited using either LPCVD or PECVD procedures, to a thickness between about 200 to 1000 Angstroms. The capping insulator layer 5, can also be a silicon nitride, or a silicon oxynitride, also serving as a bottom anti-reflective, (BARC), layer, for a subsequent photolithographic procedure. Conventional photolithographic and RIB procedures, using $CHF_3$ as an etchant for capping insulator layer 5, using $Cl_2$ as an etchant for first polysilicon layer 4, and using $CHF_3$ as an etchant for pad insulator 3, are used to create dummy polysilicon structure, shown schematically in FIG. 1. Photoresist removal is accomplished via plasma oxygen ashing and careful wet cleans.

Figure 2:
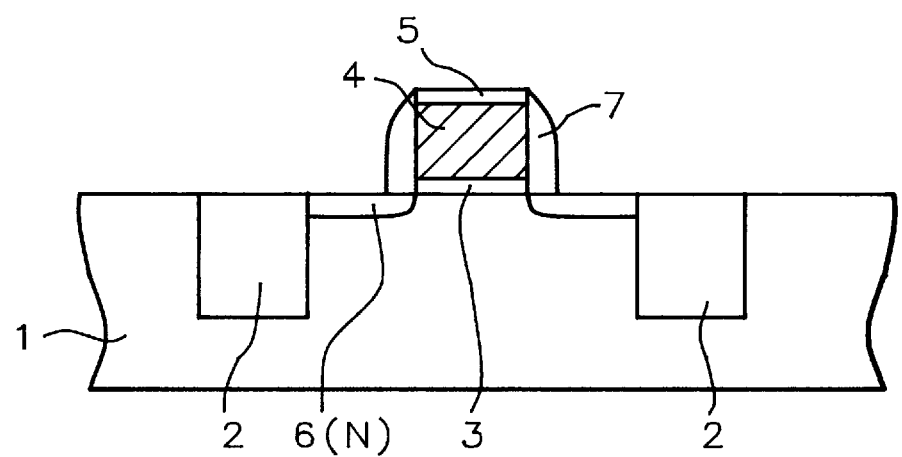
Figure 3:
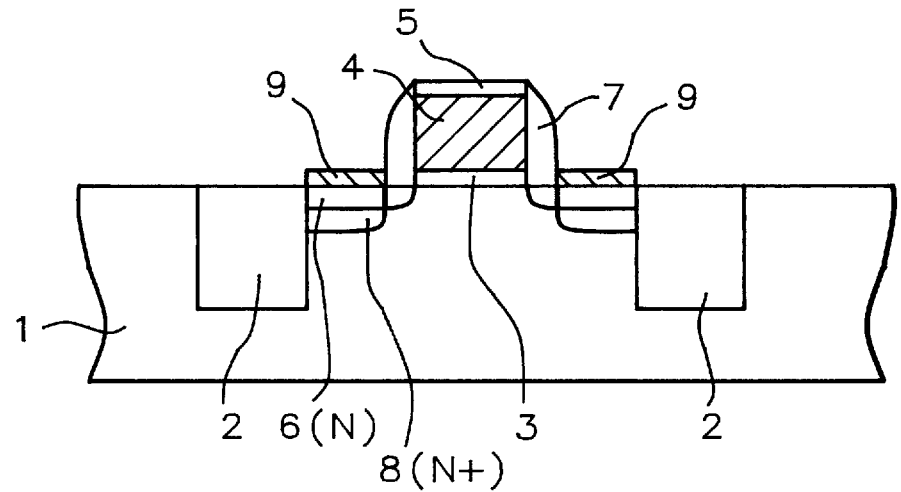

An N type, lightly doped source and drain region 6, is formed via ion implantation of either arsenic or phosphorous, at an energy between about 5 to 30 KeV, at a dose between about 1E13 to 5E14 atoms/cm$^2$. A silicon nitride spacer 7, is then formed via deposition of a silicon nitride layer, using either LPCVD or PECVD procedures, to a thickness between about 1000 to 3000 Angstroms, followed by an anisotropic RIE procedure, using $CHF_3$-$CF_4$-$O_2$, or $SF_6$-$HBr$-$O_2$, as an etchant, creating silicon nitride spacers 7, schematically shown in FIG. 2. Heavily doped, N type source and drain regions 8, are next formed via ion implantation of either arsenic or phosphorous, at an energy between about 10 to 50 KeV, at a dose between about 1E15 to 5E15 atoms/cm$^2$. An anneal, performed at a temperature between about 900° to 1050° C., is used to activate the dopants in the source and drain regions, as well as reducing the point defects created from the source and drain ion implantation procedures. This is schematically shown in FIG. 3. A metal silicide layer 9, comprised of titanium disilicide, between about 300 to 800 Angstroms in thickness, is formed on the top surface of heavily doped source and drain region 8. This is also schematically shown in FIG. 3. The titanium disilicide layer is formed by initially depositing a blanket layer of titanium, or a titanium-titanium nitride bi-layer, to a titanium thickness between about 150 to 400 Angstroms, using R.F sputtering procedures, followed by an anneal, using rapid thermal annealing, (RTA), procedures, creating metal silicide layer 9, in regions in which titanium interfaced the top surface of heavily doped source and drain region 8. If the bi-layer is used, a titanium nitride layer, between about 100 to 200 Angstroms, in thickness, is deposited on the underlying titanium layer. Unreacted titanium, on the top surface of STI regions 2, and on capping insulator layer 5, is then removed using a solution of $NH_4OH$-$H_2O_2$-$H_2O$, followed by use of either an $H_2SO_4$, or $H_3PO_4$ solution.

Figure 4:
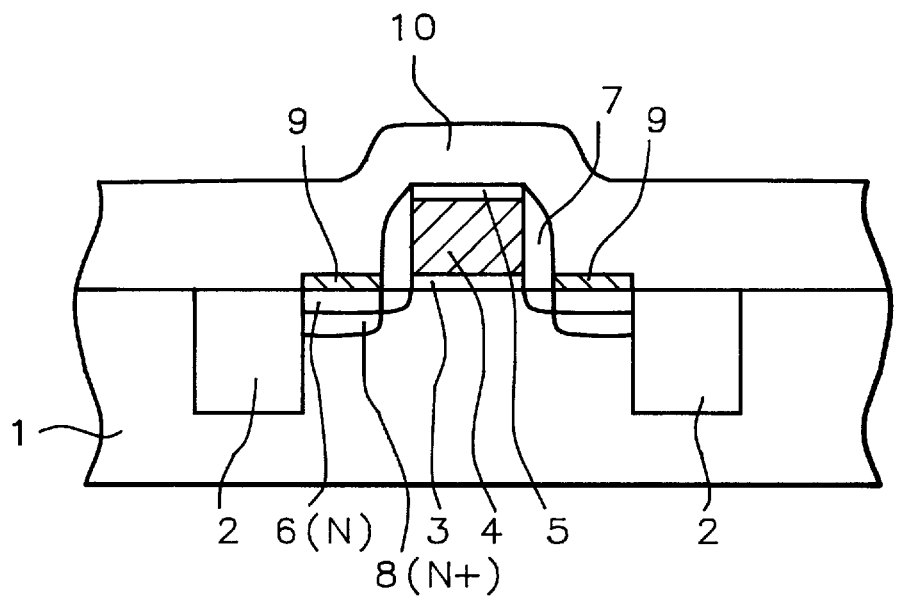
Figure 5:
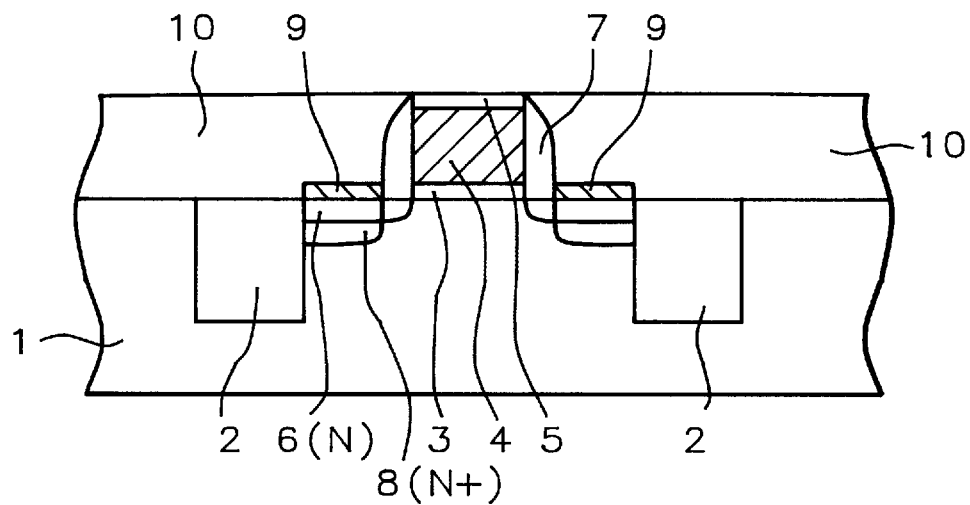
Figure 6:
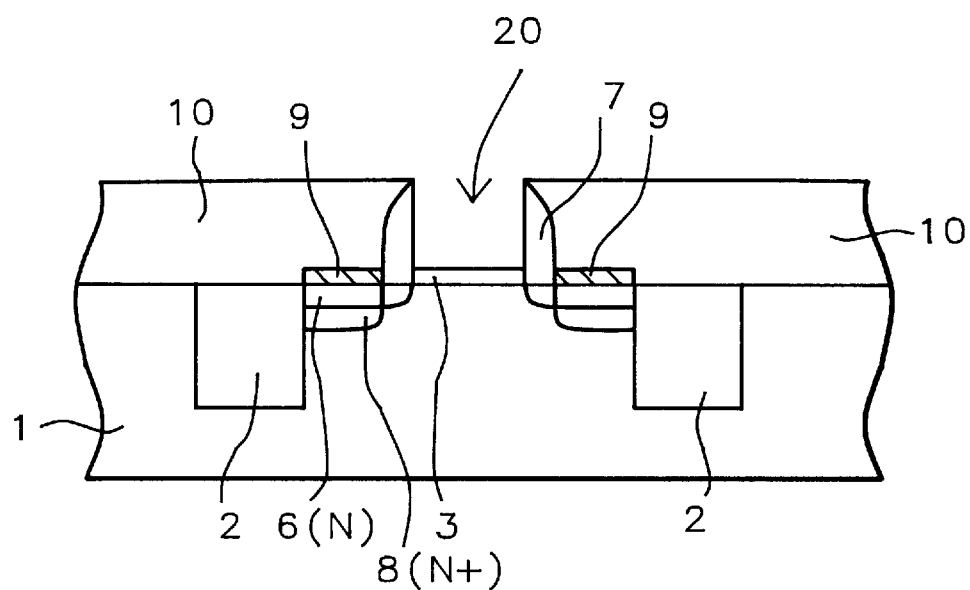
Figure 7:
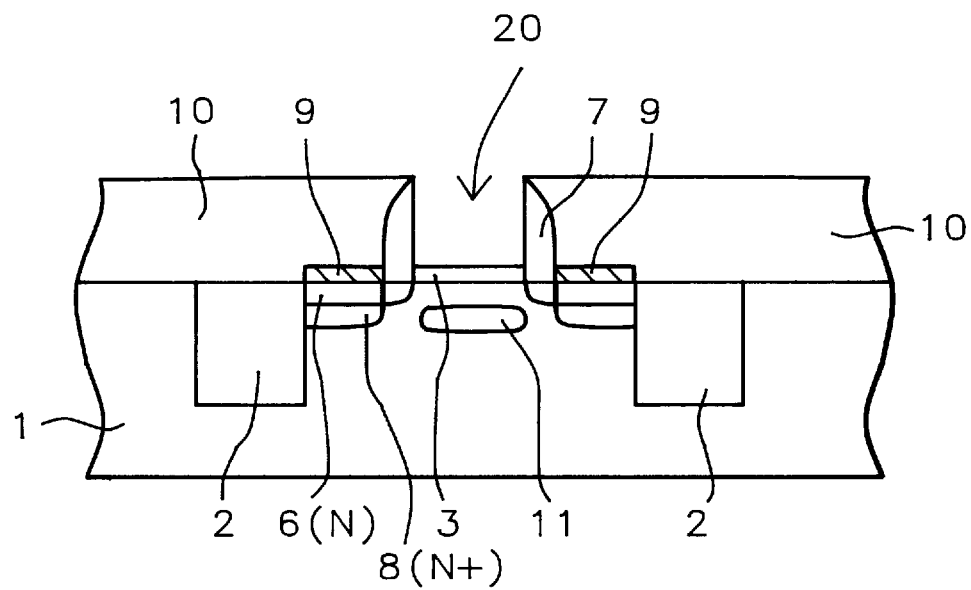

An insulator layer 10, of either doped, or undoped, silicon oxide, shown schematically in FIG. 4, obtained using either PECVD, atmospheric pressure chemical vapor deposition, (APCVD), or sub-atmospheric chemical vapor deposition, (SACVD), procedures, is deposited to a thickness between about 4000 to 10000 Angstroms. A CMP procedure is next applied to remove insulator layer 10, from the top surface of the dummy polysilicon structure, exposing the top surface of capping insulator layer 5, overlying first polysilicon layer 4. This is schematically displayed in FIG. 5. Capping insulator layer 5, as well as first polysilicon layer 4, are now removed, using a buffered HF solution if the capping insulator layer is silicon oxide, or using a hot phosphoric acid if capping insulator layer 5, is silicon nitride, or silicon oxynitride, while a KOH, or KOH and isopropanol solution, is used for removal of first polysilicon layer 4, creating opening 20, schematically shown in FIG. 6. The critical channel region 11, shown schematically in FIG. 7, is next formed. Channel region 11, is comprised of an anti-punchthrough region, obtained via ion implantation of boron or $BF_2$, at an energy between about 30 to 70 KeV, at a dose between about 4E12 to 1E13 atoms/cm, as well as a threshold adjust ion implantation procedure, again using either $BF_2$, or boron, performed at an energy between about 30 to 80 KeV, at a dose between about 1E12 to 5E12 atoms/cm$^2$. Pad insulator layer 3, serves as a screen oxide layer, preventing possible deleterious materials from entering the channel region. The anti-punchthrough region, with a higher dopant level then semiconductor substrate 1, restricts the spreading of the depletion region, created at the interface between the source and drain and the substrate. The channel region 11, placed in opening 20, is self-aligned to the adjacent source and drain regions, while being self-aligned to a soon to be formed, overlying polysilicon gate structure.

Figure 8:
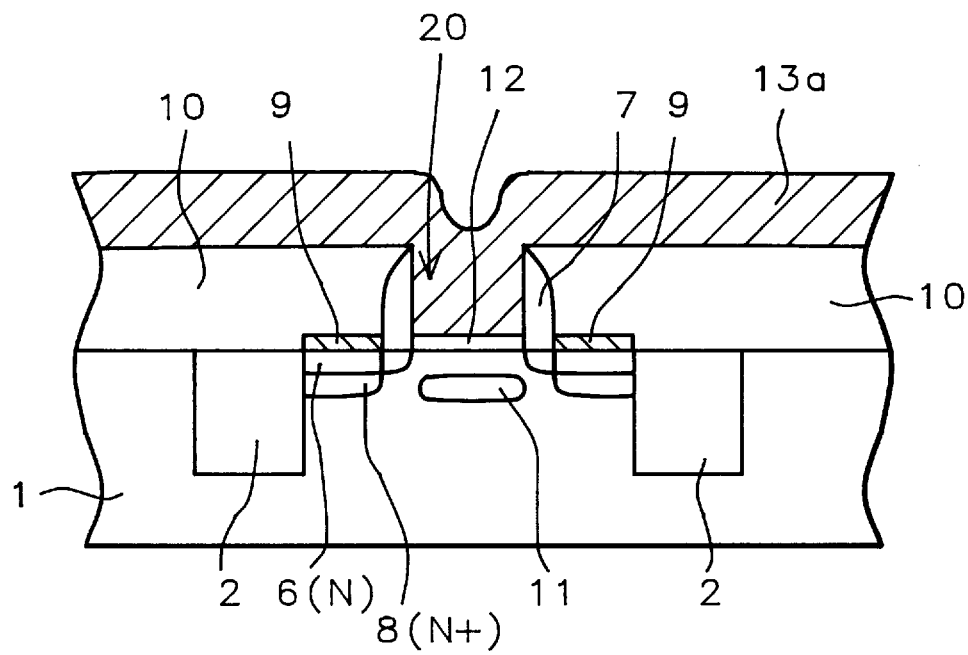
Figure 9:
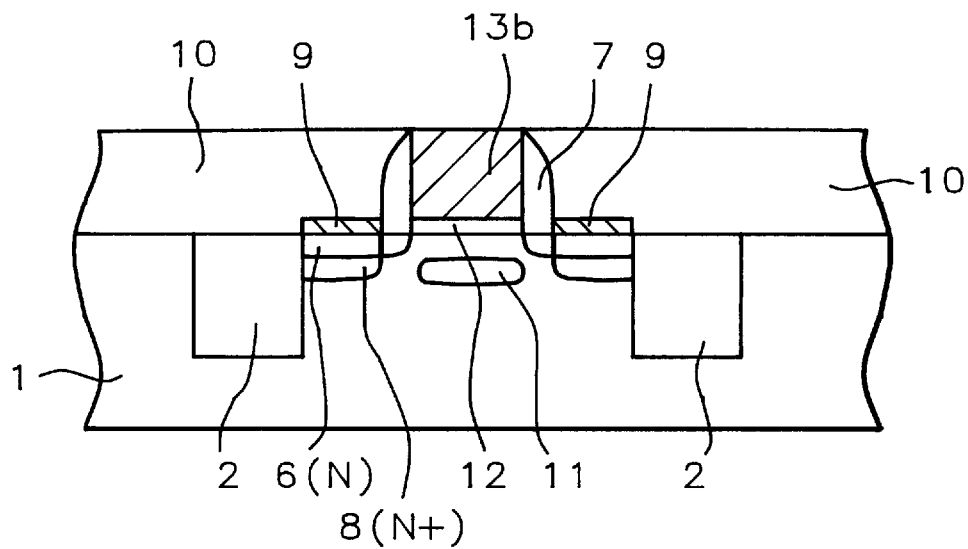
Figure 10:
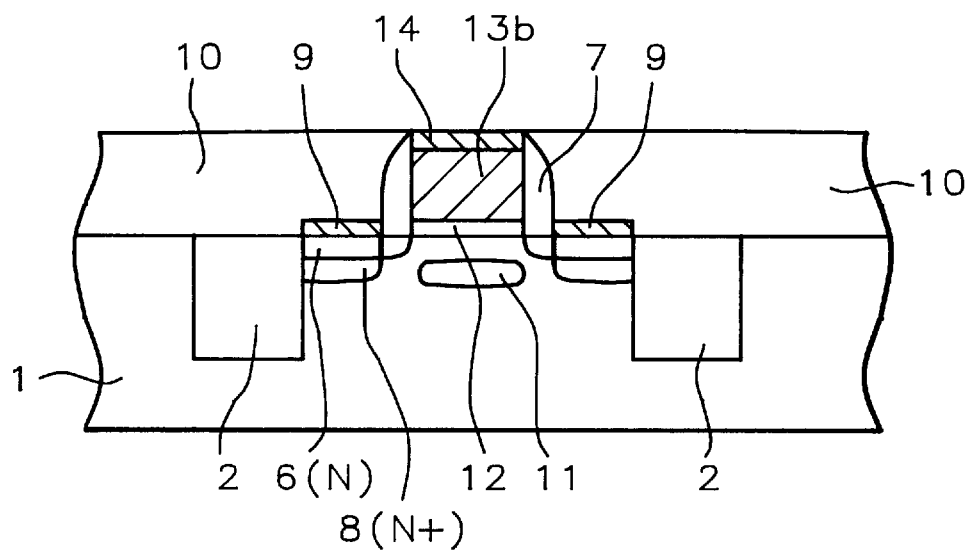

Pad insulator layer 3, is removed using a buffered hydrofluoric acid solution, followed by the growth of gate insulator layer 12, on the surface of semiconductor substrate 1, exposed in opening 20. Gate insulator 12, is comprised of silicon dioxide, thermally grown in a $H_2$-$O_2$-$N_2$ ambient, at a temperature between about 850° to 900° C., to a thickness between about 30 to 100 Angstroms. A second layer of polysilicon 13a, is next deposited, using LPCVD procedures, to a thickness between about 2000 to 4000 Angstroms, completely filling opening 20. This is schematically shown in FIG. 8. A CMP procedure is then employed to remove second polysilicon layer 13a, from the top surface of insulator layer 9, forming polysilicon gate structure 13b, in opening 20, self-aligned to the underlying channel region 11. This is schematically shown in FIG. 9.

After doping of polysilicon gate structure 13b, via ion implantation of either arsenic or phosphorous, at an energy between about 20 to 40 KeV, at a dose between about 5E14 to 5E15 atoms/cm$^2$, a layer of either cobalt or titanium is deposited using R.F. sputtering procedures, to a thickness between about 150 to 400 Angstroms. An anneal, using either a conventional furnace, or an RTA procedure is used to form the metal silicide 14, either $TiSi_2$ or $CoSi_2$, at a thickness between about 300 to 800 Angstroms, on the top surface of polysilicon gate structure 13b. Unreacted metal, on the top surface of insulator layer 10, is then removed using a $NH_4OH$-$H_2O_2$-$H_2O$ solution, followed by use of either $H_2SO_4$, or $H_3PO_4$.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, comprising the steps of:

forming trench isolation regions in said semiconductor substrate;

forming a dummy polysilicon gate structure having opposing sides on said semiconductor substrate;

forming lightly doped source and drain regions in an area of said semiconductor substrate, not covered by said dummy polysilicon gate structure;

forming insulator spacers on the sides of said dummy polysilicon gate structure;

forming heavily doped source and drain regions in an area of said semiconductor substrate, not covered by said dummy polysilicon gate structure, and not covered by said insulator spacers;

forming a first metal silicide layer on the top surface of said heavily doped source and drain regions;

depositing a first insulator layer;

planarizing said first insulator layer, thereby exposing the top surface of said dummy polysilicon gate structure;

removing said dummy gate structure, forming an opening, in said first insulator layer, with the opening coated with said insulator spacers;

forming a channel region in said semiconductor substrate, in a region of said semiconductor substrate directly underlying, said opening, in said first insulator layer;

growing a gate insulator layer on a region of said semiconductor substrate exposed in said opening, in said first insulator layer;

forming a polysilicon gate structure, on said gate insulator layer, in said opening, in said first insulator layer, with said polysilicon gate structure self-aligned to said channel region; and forming a second metal silicide layer on the top surface of said polysilicon gate structure.

2. The method of claim 1, wherein said dummy polysilicon gate structure is comprised of: a capping insulator layer of either silicon oxide, silicon nitride, or silicon oxynitride, deposited using LPCVD or PECVD procedures, to a thickness between about 200 to 1000 Angstroms; an underlying first polysilicon layer, deposited using LPCVD procedures, to a thickness between about 2000 to 6000 Angstroms; and a pad insulator layer of silicon oxide, at a thickness between about 20 to 400 Angstroms, residing on said semiconductor substrate.

3. The method of claim 1, wherein said insulator spacers are silicon nitride, formed by first depositing a silicon nitride layer, using either LPCVD or PECVD procedures, at a thickness between about 1000 to 3000 Angstroms, and then creating said insulator spacers via anisotropic RIE of the silicon nitride layer, using either $CHF_3$-$CF_4$-$O_2$, or $SF_6$-HBr-$O_2$, as an etchant.

4. The method of claim 1, wherein said heavily doped source and drain regions are created via ion implantation of either arsenic or phosphorous, at an energy between about 10 to 50 KeV, at a dose between about 1E15 to 5E15 atoms/$cm^2$.

5. The method of claim 1, wherein said first metal silicide layer is titanium disilicide, at a thickness between about 300 to 800 Angstroms.

6. The method of claim 1, wherein said first insulator layer is silicon oxide, deposited using either PECVD, SACVD, or APCVD procedures, to a thickness between about 4000 to 10000 Angstroms.

7. The method of claim 2, wherein said opening, in said first insulator layer, is formed via removal of said dummy polysilicon gate structure, by initially using hot phosphoric acid, for either a silicon nitride or a silicon oxynitride layer, or by initially using buffered HF for a silicon oxide layer, for the etchant for said capping insulator layer, then using KOH, or KOH and isopropanol, as an etchant for said first underlying polysilicon layer.

8. The method of claim 1, wherein said channel region is comprised of a threshold adjust region, and an anti-punchthrough region, with the threshold adjust region formed via ion implantation of either boron or $BF_2$, at an energy between about 30 to 80 KeV, at a dose between about 1E12 to 5E12 atoms/$cm^2$, while the anti-punchthrough region is formed via ion implantation of either boron or $BF_2$, at an energy between about 30 to 70 KeV, at a dose between about 4E12 to 1E13 atoms/$cm^2$.

9. The method of claim 1, wherein said gate insulator layer is silicon dioxide, thermally grown in an $H_2$-$O_2$-$N_2$ ambient, at a temperature between about 850° to 900° C., to a thickness between about 30 to 100 Angstroms.

10. The method of claim 1, wherein said polysilicon gate structure is comprised of a second polysilicon layer, at a thickness between about 2000 to 4000 Angstroms, and doped via ion implantation of either arsenic or phosphorous, at an energy between about 20 to 40 KeV, at a dose between about 5E14 to 5E15 atoms/$cm^2$.

11. A method of fabricating a MOSFET device, on a semiconductor substrate, wherein a source and drain region is formed prior to formation of an ion implanted channel region, and wherein a polysilicon gate structure is self-aligned to the ion implanted channel region, comprising the steps of:

forming trench isolation regions in said semiconductor substrate;

depositing a pad silicon oxide layer on said substrate;

depositing a first polysilicon layer over said pad silicon oxide layer;

depositing a capping silicon oxide layer over said first polysilicon layer;

patterning of said capping silicon oxide layer, of said first polysilicon layer, and of said pad silicon oxide layer, to form a dummy polysilicon gate structure having opposing sides;

ion implanting a first conductivity imparting dopant into a region of said semiconductor substrate, not covered by said dummy polysilicon gate structure, to a form a lightly doped source and drain region;

depositing a first silicon nitride layer;

anisotropic etching of said first silicon nitride layer, to form silicon nitride spacers, on the sides of said dummy polysilicon gate structure;

ion implanting a second conductivity imparting dopant into a region of said semiconductor substrate, not covered by said dummy polysilicon gate structure, and not covered by said silicon nitride spacers, to form a heavily doped source and drain region;

forming a first metal silicide layer on the top surface of said heavily doped source and drain region;

depositing a first insulator layer;

planarizing said first insulator layer, exposing the top surface of said dummy polysilicon gate structure;

removing said capping silicon oxide layer, and said first polysilicon layer, from said dummy polysilicon gate structure, forming an opening, in said first insulator layer, and with said opening coated with said silicon nitride spacers;

ion implanting a third conductivity imparting dopant, and a fourth conductivity imparting dopant, into a region of said semiconductor substrate, directly underlying said opening, to form said ion implanted channel region;

removing said pad silicon oxide layer, in said opening and exposing a portion of said semiconductor substrate;

growing a gate insulator layer on said portion of said semiconductor substrate;

depositing a second polysilicon layer, completely filling said opening;

removing said second polysilicon layer from the top surface of said first insulator layer, forming said polysilicon gate structure, in said opening, with said polysilicon gate structure self-aligned to said underlying ion implanted channel region;

ion implanting a fifth conductivity imparting dopant into said polysilicon gate structure; and forming a second metal silicide layer on the top surface of said polysilicon gate structure.

12. The method of claim 11, wherein said dummy polysilicon gate structure is comprised of: a capping silicon oxide layer at a thickness between about 200 to 1000 Angstroms; a first polysilicon layer, at a thickness between about 2000 to 6000 Angstroms; and an underlying pad silicon oxide layer, at a thickness between about 20 to 400 Angstroms.

13. The method of claim 11, wherein said silicon nitride spacers are formed via deposition of said silicon nitride layer, at a thickness between about 1000 to 3000 Angstroms, followed by an anisotropic RIE procedure, using either $CHF_3$-$CF_4$-$_2$, or $SF_6$-$HBr$-$O_2$, as an etchant.

14. The method of claim 11, wherein said second conductivity imparting dopant, used to form said heavily doped source and drain region, is either arsenic or phosphorous, ion implanted at an energy between about 10 to 50 KeV, at a dose between about 1E15 to 5E15 atoms/cm$^2$.

15. The method of claim 11, wherein said first metal silicide layer is titanium disilicide, at a thickness between about 300 to 800 Angstroms.

16. The method of claim 11, wherein said first insulator layer is silicon oxide, deposited using either APCVD, SACVD, or PECVD procedures, to a thickness between about 4000 to 10000 Angstroms.

17. The method of claim 11, wherein said opening, in said first insulator is formed, via initially removing said capping silicon oxide layer, using buffered HF followed by removal of said first polysilicon layer, using KOH, or a solution of KOH and isopropanol.

18. The method of claim 11, wherein said third conductivity imparting dopant, used to create a threshold adjust region, in said ion implanted channel region, is boron or $BF_2$, ion implanted at an energy between about 30 to 80 KeV, at a dose between about 1E12 to 5E12 atoms/cm$^2$.

19. The method of claim 11, wherein said fourth conductivity imparting dopant, used to create an anti-punchthrough region, in said ion implanted channel region, is either boron or $BF_2$, ion implanted at an energy between about 30 to 70 KeV, at a dose between about 4E12 to 1E13 atoms/cm$^2$.

20. The method of claim 11, wherein said gate insulator layer is silicon dioxide, thermally grown in a $H_2$-$O_2$-$N_2$ ambient, at a temperature between about 850° to 900° C., to a thickness between about 30 to 100 Angstroms.

21. The method of claim 11, wherein said second polysilicon layer is deposited using LPCVD procedures, to a thickness between about 2000 to 4000 Angstroms.

22. The method of claim 11, wherein said polysilicon gate structure, self-aligned to said underlying ion implanted channel region, is formed in said opening by removal of said second polysilicon layer, from the top surface of said first insulator layer, using CMP procedures.

* * * * *